United States Patent
Rivolta et al.

(10) Patent No.: US 11,821,732 B2
(45) Date of Patent: Nov. 21, 2023

(54) ELECTRONIC DEVICE INCLUDING BAG DETECTION

(71) Applicant: STMICROELECTRONICS S.r.l., Agrate Brianza (IT)

(72) Inventors: Stefano Paolo Rivolta, Desio (IT); Federico Rizzardini, Settimo Milanese (IT); Lorenzo Bracco, Chivasso (IT); Roberto Mura, Milan (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 213 days.

(21) Appl. No.: 17/144,016

(22) Filed: Jan. 7, 2021

(65) Prior Publication Data
US 2022/0214168 A1 Jul. 7, 2022

(51) Int. Cl.
*H01J 37/32* (2006.01)
*G01C 19/60* (2006.01)
*G01B 7/00* (2006.01)
*H03K 17/945* (2006.01)
*H01J 37/317* (2006.01)

(52) U.S. Cl.
CPC ............. *G01C 19/60* (2013.01); *G01B 7/003* (2013.01); *H03K 17/945* (2013.01)

(58) Field of Classification Search
CPC ...... G01C 19/60; G01B 7/003; G01B 11/026; H03K 17/945; G01S 17/89
See application file for complete search history.

(56) References Cited

U.S. PATENT DOCUMENTS

| | | | | |
|---|---|---|---|---|
| 7,016,705 | B2* | 3/2006 | Bahl | H04W 52/0277 455/574 |
| 8,180,583 | B1* | 5/2012 | Gossweiler | G06F 1/3231 702/62 |
| 8,989,792 | B1* | 3/2015 | Depew | H04B 1/3838 455/575.4 |
| 9,161,175 | B1* | 10/2015 | Smith | G01S 5/02521 |
| 2012/0025902 | A1* | 2/2012 | Chuang | G06F 1/3231 327/544 |
| 2013/0033418 | A1* | 2/2013 | Bevilacqua | G06F 3/0346 345/156 |
| 2014/0025973 | A1* | 1/2014 | Schillings | H04W 52/0212 713/323 |
| 2014/0129178 | A1* | 5/2014 | Meduna | G06F 3/017 702/189 |

(Continued)

OTHER PUBLICATIONS

Stefano Paolo Rivolta et al., "Method and System for Managing Power States Transitions of a Portable Electronic Device, and Portable Electronic Device," U.S. Appl. No. 17/168,110, filed Feb. 4, 2021, 60 pages.

*Primary Examiner* — Rebecca C Bryant
*Assistant Examiner* — Christopher J Gassen
(74) *Attorney, Agent, or Firm* — SEED IP LAW GROUP LLP

(57) ABSTRACT

The present disclosure is directed to a device configured to detect whether the device is in a bag or outside of the bag. The device determines whether the device is in or outside of the bag based on distance measurements generated by at least one proximity sensor and motion measurements generated by at least one motion sensor. By using both distance measurements and motion measurements, the device is able to detect whether the device is in the bag or outside of the bag with high accuracy and robustness.

12 Claims, 8 Drawing Sheets

(56) References Cited

U.S. PATENT DOCUMENTS

| | | | |
|---|---|---|---|
| 2015/0221278 A1* | 8/2015 | Le Grand | G06F 1/3215 |
| | | | 345/156 |
| 2015/0230183 A1* | 8/2015 | Stogaitis | G06F 3/0346 |
| | | | 455/574 |
| 2016/0212710 A1* | 7/2016 | Ting | H04W 52/028 |
| 2020/0326767 A1* | 10/2020 | Iyer | G06F 1/1677 |

* cited by examiner

ELECTRONIC DEVICE INCLUDING BAG DETECTION

BACKGROUND

Technical Field

The present disclosure is directed to a device and method for detecting whether an electronic device is in a bag or outside of the bag.

Description of the Related Art

Many electronic devices support a comprehensive and system-wide set of power management features to improve user experience, extend battery duration, save energy, and reduce heat and noise of the device. Power management features are particularly important for portable devices, such as laptop computers, tablets, and mobile devices, due to their limited power supply.

Power management features typically include options to transition the device between several different power states. For example, many devices support intermediate power states that are between an off state (e.g., the device is completely shut down and consumes no power) and an on state (e.g., the device is powered on and ready to be used by a user). Intermediate power states may include a sleep state in which the device is in a reduced power, idle state; and a hibernate state that is similar to the sleep state but consumes even less power. Intermediate power states allow a device to quickly return to an on state when the device is ready to be used by a user.

Many devices, such as laptop computers, allow the manufacturer or user to customize transitions between power states based on detected events. For example, a laptop computer may switch from an on state to a sleep state after 15 minutes of user inactivity, switch from an on state to a hibernate state in response to the laptop computer being closed (e.g., folding the monitor to a closed position), and switch from a hibernate or sleep state to an on state in response to a power button being pushed by a user.

BRIEF SUMMARY

The present disclosure is directed to a device that detects whether the device is in a bag (e.g., a briefcase, backpack, and sleeve) or outside of the bag. The device determines whether the device is in or outside of the bag based on distance measurements generated by at least one proximity sensor and motion measurements generated by at least one motion sensor. By using both distance measurements and motion measurements, the device is able to detect whether the device is in the bag or outside of the bag with high accuracy and robustness.

A power state of the device is adjusted based on whether the device is in the bag or outside of the bag. For example, the device may be set to an off state in response to detecting that the device is in the bag, and set to a low power state in response to detecting that the device is outside of the bag.

BRIEF DESCRIPTION OF THE SEVERAL VIEWS OF THE DRAWINGS

In the drawings, identical reference numbers identify similar features or elements. The size and relative positions of features in the drawings are not necessarily drawn to scale.

DETAILED DESCRIPTION

Figure 1A:
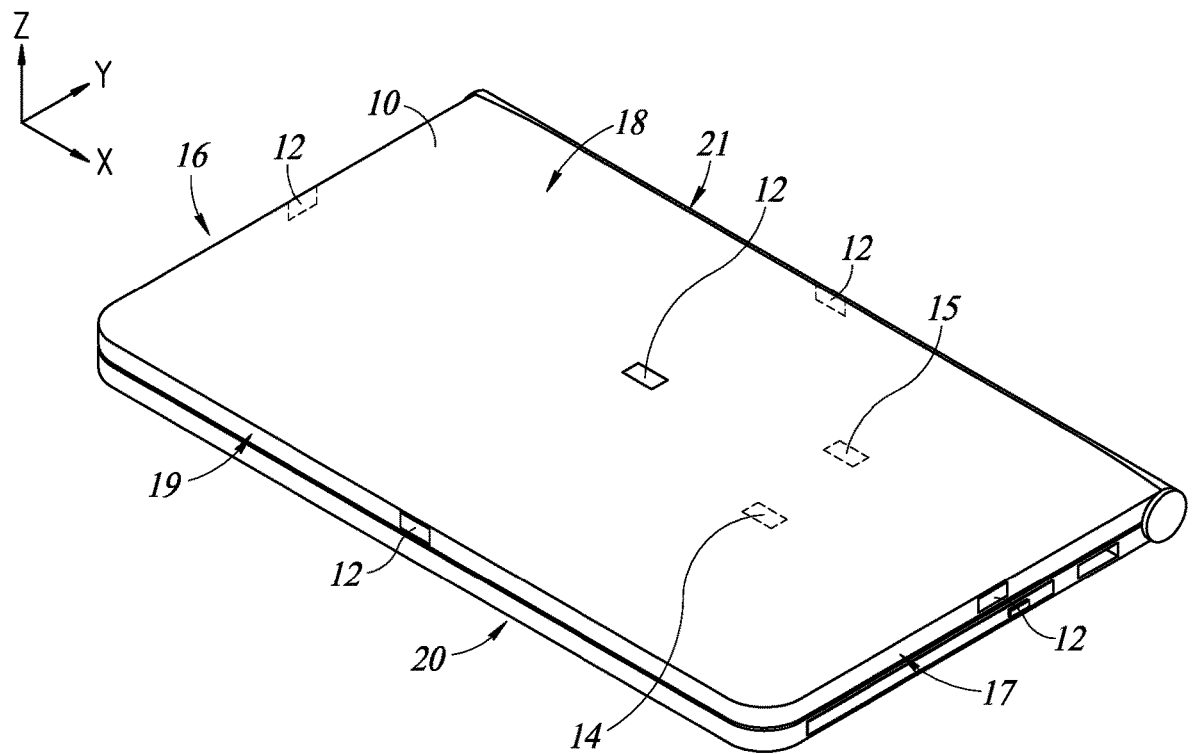
FIG. 1A is a first angled, perspective view of a device according to an embodiment disclosed herein.

In the following description, certain specific details are set forth in order to provide a thorough understanding of various aspects of the disclosed subject matter. However, the disclosed subject matter may be practiced without these specific details. In some instances, well-known power states, and structures and methods of manufacturing electronic devices and sensors have not been described in detail to avoid obscuring the descriptions of other aspects of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

It is noted that the dimensions set forth herein are provided as examples. Other dimensions are envisioned for this embodiment and all other embodiments of this application.

As discussed above, many devices allow a manufacturer or user to customize transitions between power states of the device based on detected events. For example, a laptop computer may switch from an on state to a sleep state after 15 minutes of user inactivity, switch from an on state to a hibernate state in response to the laptop computer being closed (e.g., folding the monitor to a closed position), and switch from a hibernate or sleep state to an on state in response to a power button being pushed by a user.

It is desirable for device manufacturers to allow further customization of power state transitions by detecting additional events for triggering the power state transitions. Events that do not require direct interaction from the user are particularly desirable because the device does not have to rely on a user's action (e.g., pressing a power button, opening a laptop computer, closing a laptop computer, etc.). Rather, the device may preemptively trigger a power state transition for the user. As a result, user experience, battery duration, energy conservation, and heat and noise of a device may be improved further.

The present disclosure is directed to a device that detects whether the device is in a bag or outside of the bag. The bag may be a briefcase, backpack, sleeve, or any other type of container that holds the device. The device determines whether the device is in or out of the bag by using at least one distance measurement generated by a proximity sensor included in the device, and at least one motion measurement generated by a motion sensor included in the device. The device subsequently transitions between power states based on detecting whether the device is in or out of the bag.

Figure 1B:
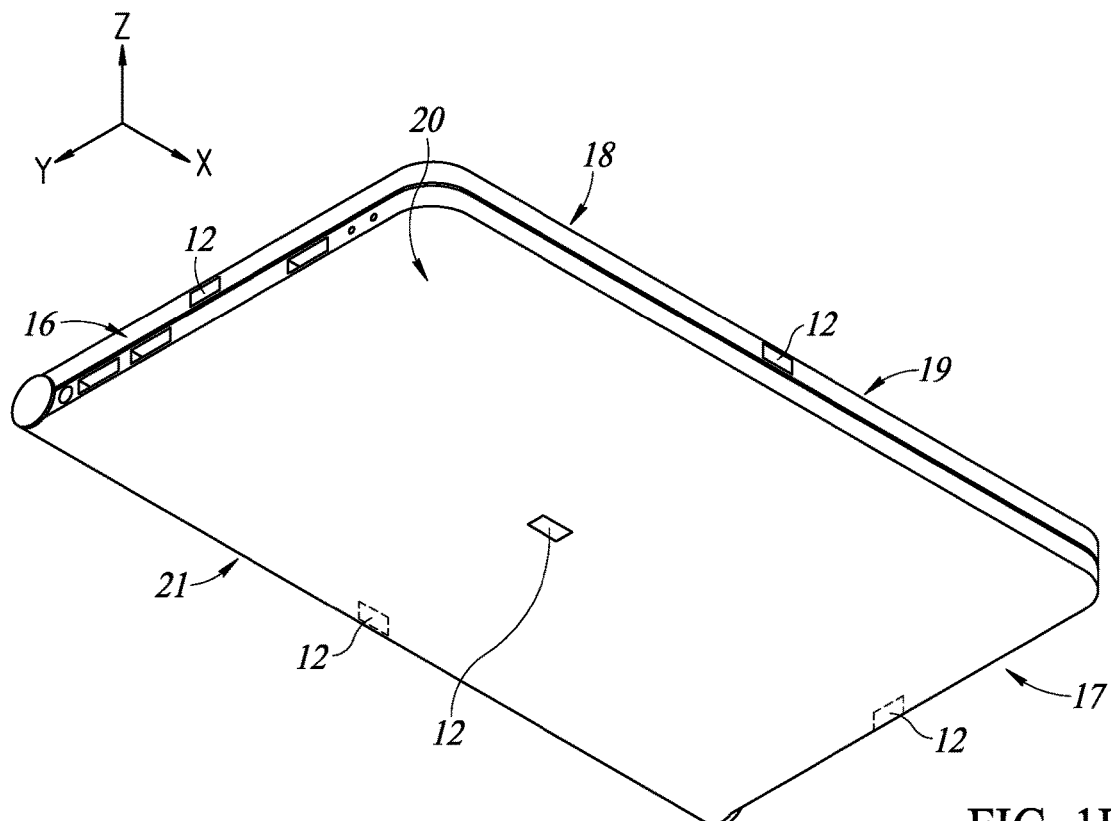
FIG. 1B is a second angled, perspective view of the device of FIG. 1A according to an embodiment disclosed herein.

FIG. 1A is a first angled, perspective view of a device 10 according to an embodiment disclosed herein. FIG. 1B is a second angled, perspective view of the device 10 according to an embodiment disclosed herein. A length of the device 10 extends along an x axis, a width of the device 10 extends along a y axis, and a height of the device 10 extends along a z axis. It is beneficial to review FIGS. 1A and 1B together.

The device 10 is an electronic device that is configured to detect whether the device 10 is in a bag or outside of the bag. In the embodiment shown in FIGS. 1A and 1B, the device 10 is a laptop computer. However, the device 10 may be any type of electronic device that may be stored or carried in a bag. For example, the device 10 may be a laptop computer, a tablet, a cellular phone, or any type of mobile device. The device 10 includes a plurality of proximity sensors 12, a motion sensor 14, and a sensor controller 15.

Each of the proximity sensors 12 is configured to measure a distance between the proximity sensor and a target object outside of the device 10 (e.g., an inner surface of a bag positioned in front of the proximity sensor), and generate a distance measurement that indicates the measured distance. In one embodiment, the distance measurement is in the form of an electrical signal (e.g., voltage or current signal) that is proportional to the measured distance. Each of the proximity sensors 12 may be a time-of-flight sensor. Operation of the proximity sensors 12 will be discussed in further detail below.

The proximity sensors 12 are positioned on each side of the device 10. For example, as shown in FIGS. 1A and 1B, proximity sensors 12 are positioned at, in, or on a first side surface 16, a second side surface 17, an upper surface 18, a front surface 19, a lower surface 20, and a rear surface 21 of the device 10. The first side surface 16, the second side surface 17, the upper surface 18, the front surface 19, the lower surface 20, and the rear surface 21 are exterior surfaces of the device 10 that are exposed to a surrounding environment.

As shown in FIGS. 1A and 1B, a proximity sensor 12 is positioned at a center portion of the first side surface 16, the second side surface 17, the upper surface 18, the front surface 19, the lower surface 20, and the rear surface 21. In one embodiment, in the case where the device 10 is a laptop computer, the proximity sensors 12 on the first side surface 16, the second side surface 17, the upper surface 18, the front surface 19, and the rear surface 21 are positioned on an upper portion of the laptop computer that includes a screen.

Each of the proximity sensors 12 may be an array of proximity sensors. For example, each of the proximity sensors 12 may include an array of time-of-flight sensors. The time-of-flight sensors may be an array of single photon avalanche diodes (SPAD) that are coupled to output one or more distance measurements.

Although six proximity sensors are shown in FIGS. 1A and 1B, the device 10 may include any number of proximity sensors. For instance, the device 10 includes a single proximity sensor that is, for example, positioned at or in the upper surface 18.

The motion sensor 14 is configured to measure a motion of the device 10, and generate a motion measurement that indicates the measured motion. In one embodiment, the motion measurement is in the form of an electrical signal (e.g., voltage or current signal) that is proportional to the measured motion.

The motion sensor 14 may be an accelerometer that measures acceleration along at least one axis. Alternatively, the accelerometer measures acceleration along three axes (e.g., along the x, y, and z axes shown in FIGS. 1A and 1B).

The motion sensor 14 may also be a gyroscope that measures angular velocity along at least one axis or that measures angular velocity along three axes (e.g., along the x, y, and z axes shown in FIGS. 1A and 1B).

In one embodiment, the motion sensor 14 is a combination sensor that includes both an accelerometer and a gyroscope, where the motion sensor 14 measures both acceleration and angular velocity. Operation of the motion sensor 14 will be discussed in further detail below.

Although a single motion sensor 14 is shown in FIGS. 1A and 1B, the device 10 may include any number of motion sensors. For instance, the device 10 includes a first motion sensor that is an accelerometer, and a second motion sensor that is a gyroscope.

The sensor controller 15 is communicatively coupled to the proximity sensors 12 and the motion sensor 14. The sensor controller 15 is configured to receive distance measurements from the proximity sensors 12 and motion measurements from the motion sensor 14, and determine whether the device 10 is in a bag or outside of the bag based on the distance measurements and motion measurements. The sensor controller 15 is also configured to adjust a power state of the device 10. The sensor controller 15 may be a processor, controller, signal processor, or any other type of processing unit. Operation and the location of the sensor controller 15 within the device 10 will be discussed in further detail below.

Figure 2:
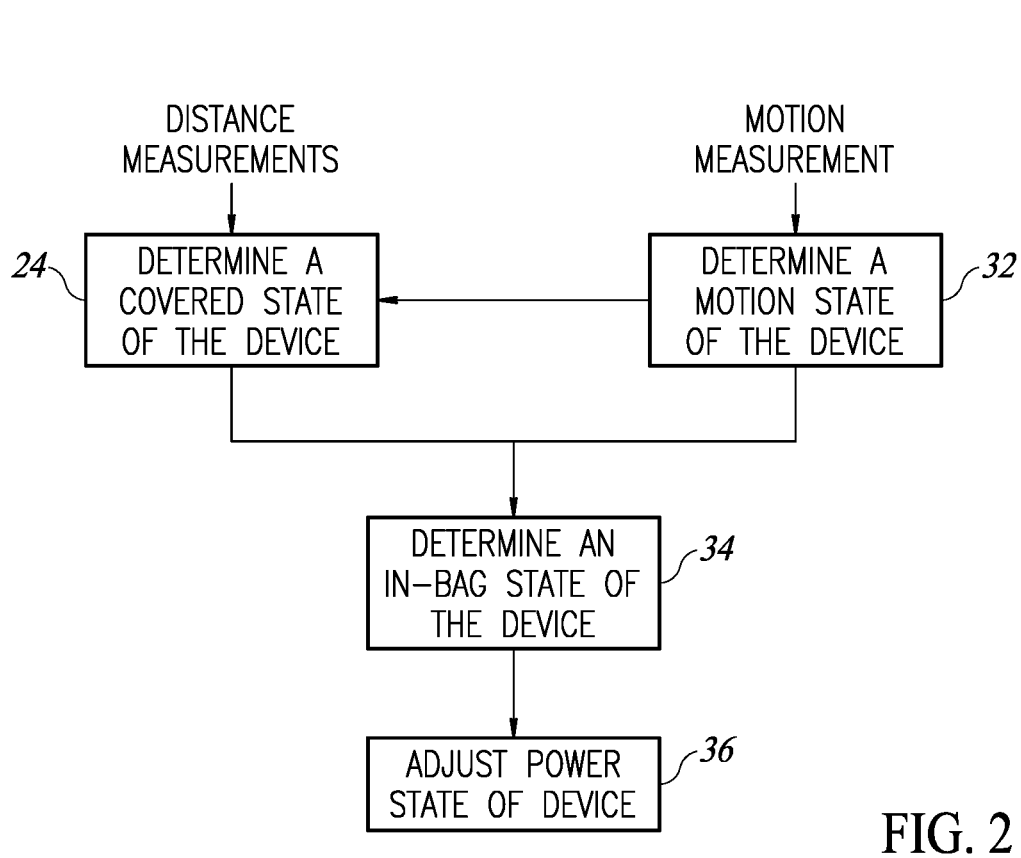
FIG. 2 is a flow diagram of a method of operating a device according to an embodiment disclosed herein.

FIG. 2 is a flow diagram of a method 22 of operating the device 10 according to an embodiment disclosed herein. The method 22 is performed by the sensor controller 15.

In block 24, the sensor controller 15 receives distance measurements from the proximity sensors 12. As discussed above, each of the proximity sensors 12 is configured to measure a distance between the proximity sensor and a target object outside of the device 10 (e.g., an inner surface of a bag), and generate a distance measurement that indicates the measured distance. Subsequently, the sensor controller 15 determines a covered state of the device 10 based on the received distance measurements.

The covered state of the device 10 indicates whether or not the device 10 is currently covered by an object, such as an inner surface of a bag (e.g., a briefcase, backpack, sleeve, or any other type of container used to hold the device). Stated differently, the covered state indicates whether or not an object is on or near the device 10.

A small distance measurement (e.g., less than 5 centimeters) between a proximity sensor and a target object is indicative of the device 10 being covered on the corresponding surface. For example, a small distance measurement between the proximity sensor 12 at the upper surface 18 and a target object indicates that the target object is positioned on or near the upper surface 18. A large distance measurement (e.g., greater than 5 centimeters) between a proximity sensor and a target object is indicative of the device 10 being uncovered on the corresponding surface. For example, a large distance measurement between the proximity sensor 12 at the front surface 19 and a target object indicates that the target object is not positioned on or near the front surface 19. Accordingly, the sensor controller 15 is able to determine that the device 10 is in a covered state in a case where one or more of the proximity sensors 12 measures a distance that is less than a threshold value, and determine that the device 10 is not in the covered state (i.e., an uncovered state) in a case where one or more of the proximity sensors 12 measures a distance that is greater than or equal to a threshold value. The threshold value may be any distance value (e.g., 5 centimeters, 10 centimeters, etc.).

In one embodiment, the sensor controller 15 determines that the device 10 is in a covered state in a case where all the distance measurements received from the proximity sensors 12 is less than a threshold value. Conversely, the sensor controller 15 determines that the device 10 is not in the covered state (i.e., an uncovered state) in a case where one or more of the distance measurements received from the proximity sensors 12 is greater than or equal to the threshold value.

In one embodiment, the sensor controller 15 determines that the device 10 is in a covered state in a case where an average of the distance measurements received from the proximity sensors 12 is less than a threshold value. Conversely, the sensor controller 15 determines that the device 10 is not in the covered state (i.e., an uncovered state) in a case where the average of the distance measurements received from the proximity sensors 12 is greater than or equal to the threshold value. A weighted average may be used to give particular proximity sensors more weight than other sensors.

The sensor controller 15 utilizes multiple different thresholds for different proximity sensors and/or logic to determine whether the device 10 is in a covered state. For example, the sensor controller 15 determines that the device 10 is in a covered state in a case where the following equation is met:

($d1$<5 cm OR $d2$<5 cm) AND ($d3$<10 cm AND $d4$<10 cm) AND ($d5$<5 cm AND $d6$<5 cm)

where $d1$ is the distance measurement received from the proximity sensor at the first side surface 16, $d2$ is the distance measurement received from the proximity sensor at the second side surface 17, $d3$ is the distance measurement received from the proximity sensor at the front surface 19, $d4$ is the distance measurement received from the proximity sensor at the rear surface 21 rear surface 21, $d5$ is the distance measurement received from the proximity sensor at the upper surface 18, and $d6$ is the distance measurement received from the proximity sensor at the lower surface 20. The multiple different thresholds and logic allows the sensor controller 15 to account for different types of scenarios.

In the embodiments described above, the covered state of the device 10 is a binary value. Namely, the covered state indicates either that the device 10 is covered or that the device 10 is not covered. In another embodiment, the covered state of the device 10 is a probability value that indicates the likelihood that the device 10 is covered. A high probability value (e.g., greater than 0.5 or 50%) indicates that the device 10 is most likely covered, and a low probability value (e.g., less than 0.5 or 50%) indicates that the device 10 is most likely uncovered.

In one embodiment, each of the proximity sensors 12 is associated with a probability function that relates or maps a distance measured by the proximity sensor to a probability value indicating the likelihood that the device 10 is covered by an object. Generally, the probability function decreases the probability value as the distance increases.

Figure 3:
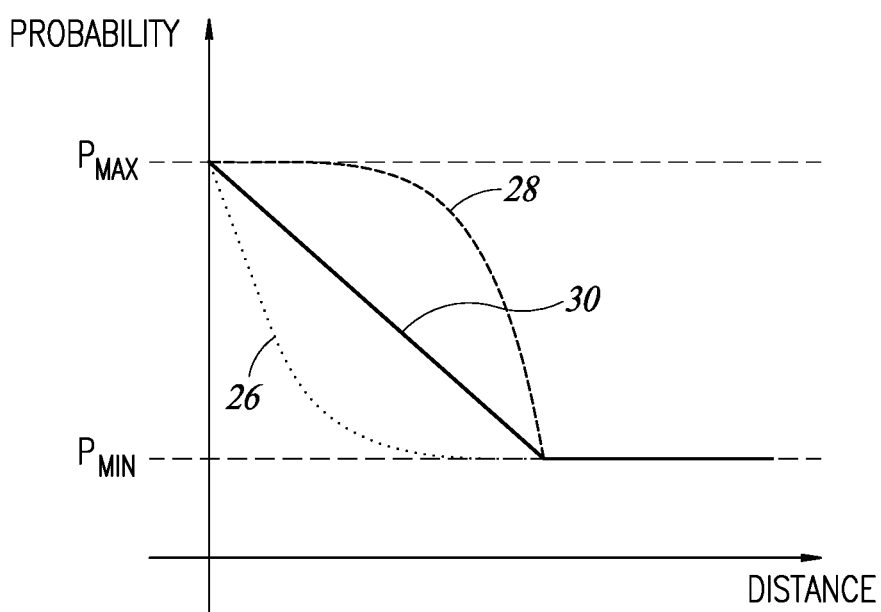
FIG. 3 represents a set of probability functions for proximity sensors according to an embodiment disclosed herein.

FIG. 3 represents a set of probability functions for proximity sensors according to an embodiment disclosed herein. In particular, FIG. 3 shows a first probability function 26, a second probability function 28, and a third probability function 30 that may be associated with a particular proximity sensor. The horizontal axis represents a distance between a proximity sensor and a target object, and the vertical axis represents a probability that the device 10 is covered by an object. $P_{max}$ is a maximum probability value (e.g., 1 or 100%) that indicates the device 10 is covered by an object, and $P_{min}$ is a minimum probability value (e.g., 0 or 0%) that indicates the device 10 is not covered by an object. As shown in FIG. 3, the probability of the device 10 being covered by an object decreases as the distance between the proximity sensor and the target object increases.

The probability function may be curved or linear. For example, the first probability function 26 and the second probability function 28 are both curved probability functions. Comparing the first probability function 26 and the second probability function 28 to each other, the probability of the device 10 being covered by an object decreases at a higher rate initially as the distance increases for the first probability function 26 and at a slower rate after the probability reaches 0.5 or 50%; on the contrary, the probability of the device 10 being covered by an object decreases at a slower rate initially as the distance increases for the second probability function 28 and at a higher rate after the probability reaches 0.5 or 50%. The third probability function 30 is a linear probability function that linearly decreases the probability of the device 10 being covered by an object as the distance increases. Although three probability functions are shown in FIG. 3, other probability functions are also possible.

The sensor controller 15 calculates the probability value of the device 10 being covered by an object based on the received distance measurements and the probability functions associated with the proximity sensors 12.

In one embodiment, the sensor controller 15 calculates the probability value for each of the proximity sensors 12 by applying the associated probability function to the distance measurement received from the proximity sensor (e.g., using the probability function to determine the probability value that corresponds to the received distance measurement), multiplies the probability values with each other, and sets the multiplication of the probability values as the covered state of the device 10.

Additionally or alternatively, the sensor controller 15 can calculate the probability value for each of the proximity sensors 12 by applying the associated probability function to the distance measurement received from the proximity sensor (e.g., using the probability function to determine the probability value that corresponds to the received distance measurement), and sets one of the probability values as the covered state of the device 10.

In one embodiment, the sensor controller 15 calculates the probability value for each of the proximity sensors 12 by applying the associated probability function to the distance measurement received from the proximity sensor (e.g., using the probability function to determine the probability value that corresponds to the received distance measurement), calculates an average or weighted average of the probability values, and sets the average or weighted average of the probability values as the covered state of the device 10.

Returning to FIG. 2, in block 32, the sensor controller 15 receives a motion measurement from the motion sensor 14. As discussed above, the motion sensor 14 is configured to measure a motion of the device 10, and generate a motion measurement that indicates the measured motion. Subsequently, the sensor controller 15 determines a motion state of the device 10 based on the received motion measurement.

In one embodiment, the motion state of the device 10 indicates whether or not the device 10 is currently in motion. Stated differently, the motion state indicates whether or not the device 10 is being moved by a user. In this embodiment, a large motion measurement (e.g., in the case where the motion sensor 14 is an accelerometer, greater than 10 meters/second) indicates that the device 10 is being moved by a user, and a small motion measurement (e.g., in the case where the motion sensor 14 is an accelerometer, less than 10 meters/second) indicates that the device 10 is not being moved by a user (i.e., the device 10 is stationary). Accordingly, the sensor controller 15 determines that the device 10 is in a motion state in a case where the motion measurement received from the motion sensor 14 is greater than or equal to a threshold value. Conversely, the sensor controller 15 determines that the device 10 is not in the motion state (i.e., a stationary state) in a case where the motion measurement received from the motion sensor is less than the threshold value. The threshold value may be set at any value (e.g., 5 meters/second, 10 meters/second, etc.). In one embodiment, the sensor controller 15 applies a high pass filter to the motion measurements received from the motion sensor 14. The high pass filter may be used to remove a gravity component from the motion measurements.

The motion state of the device 10 indicates whether or not the device 10 is currently being placed or inserted in a bag (e.g., a briefcase, backpack, sleeve, or any other type of container used to hold the device). In one embodiment, a large, downward motion indicates that the device 10 is being placed in a bag by a user. In one embodiment, the sensor controller 15 determines that the device 10 is being placed in bag in a case where the motion measurement received from the motion sensor 14 is in a first direction and is greater than or equal to a threshold value. For example, in the case where the motion sensor 14 is an accelerometer, the sensor controller 15 determines that the device 10 is being placed in bag when acceleration along an axis (e.g., the y axis in FIG. 1A) is in a first direction and is greater than a threshold value. The threshold value may be set at any value (e.g., 5 meters/second, 10 meters/second, etc.). In another embodiment, machine learning techniques are applied to the motion measurements received from the motion sensor 14 to detect if the device 10 is being placed or inserted in a bag.

In one embodiment, the motion state of the device 10 indicates whether or not the device 10 is currently being taken out of a bag. In one embodiment, a large, upward motion indicates that the device 10 is being taken out of the bag. In one embodiment, the sensor controller 15 determines that the device 10 is being taken out of the bag in a case where the motion measurement received from the motion sensor is in a second direction and is greater than or equal to the threshold value. For example, in the case where the motion sensor 14 is an accelerometer, the sensor controller 15 determines that the device 10 is being taken out of the bag when acceleration along the axis is in a second direction opposite to the first direction and is greater than the threshold value. In another embodiment, machine learning techniques are applied to the motion measurements received from the motion sensor 14 to detect if the device 10 is being taken out of a bag.

In the embodiments described above, the motion state of the device 10 is a binary value. For example, the motion state indicates either that the device 10 is in motion or that the device 10 is not in motion. In another embodiment, the motion state of the device 10 is a probability value.

In the embodiment where the motion state of the device 10 indicates whether or not the device 10 is currently in motion, the probability value indicates the likelihood that the device 10 is in motion (e.g., the device 10 is being moved by a user). A high probability value (e.g., greater than 0.5 or 50%) indicates that the device 10 is most likely in motion, and a low probability value (e.g., less than 0.5 or 50%) indicates that the device 10 is most likely not in motion.

In the embodiment where the motion state of the device 10 indicates whether or not the device 10 is being placed in a bag, the probability value indicates the likelihood that the device 10 is being placed in a bag. A high probability value (e.g., greater than 0.5 or 50%) indicates that the device 10 is most likely being placed in the bag, and a low probability value (e.g., less than 0.5 or 50%) indicates that the device 10 is most likely not being placed in the bag.

In the embodiment where the motion state of the device 10 indicates whether or not the device 10 is currently being taken out of a bag, the probability value indicates the likelihood that the device 10 is being taken out of a bag. A high probability value (e.g., greater than 0.5 or 50%) indicates that the device 10 is most likely being taken out of the bag, and a low probability value (e.g., less than 0.5 or 50%) indicates that the device 10 is most likely not being taken out of the bag.

In one embodiment, the motion sensor 14 is associated with a probability function that relates or maps a motion measured (e.g., acceleration, angular velocity, etc.) by the motion sensor 14 to a probability value. Generally, the probability function increases the probability value as the motion increases. In one embodiment, a probability function that is the inverse of the first probability function 26, the second probability function 28, or the third probability function 30 discussed with respect to FIG. 3 is associated with the motion sensor 14.

In the embodiment where the motion state of the device 10 indicates whether or not the device 10 is currently in motion, the sensor controller 15 calculates the probability value of the device 10 being in motion based on the received motion measurement and the probability function associated with the motion sensor 14. For example, the sensor controller 15 calculates the probability value by applying the associated probability function to the motion measurement received from the motion sensor 14 (e.g., using the probability function to determine the probability value that corresponds to the received motion measurement), and sets the probability value as the motion state of the device 10.

In the embodiment where the motion state of the device 10 indicates whether or not the device 10 is currently being placed in a bag, the sensor controller 15 calculates the probability value of the device 10 being put in the bag based on the received motion measurement and the probability function associated with the motion sensor 14. For example, the sensor controller 15 calculates the probability value by applying the associated probability function to the motion measurement received from the motion sensor 14 (e.g., using the probability function to determine the probability value that corresponds to the received motion measurement), and sets the probability value as the motion state of the device 10.

In the embodiment where the motion state of the device 10 indicates whether or not the device 10 is currently being taken out of the bag, the sensor controller 15 calculates the probability value of the device 10 being taken out of the bag based on the received motion measurement and the probability function associated with the motion sensor 14. For example, the sensor controller 15 calculates the probability value by applying the associated probability function to the motion measurement received from the motion sensor 14 (e.g., using the probability function to determine the probability value that corresponds to the received motion measurement), and sets the probability value as the motion state of the device 10.

In one embodiment, the determinations in blocks 24 and 32 are performed concurrently. Alternatively, the determination in block 32 is performed prior to the determination in block 24.

In one embodiment, the proximity sensors 12 are set in an off state by default to conserve energy, and the sensor controller 15 enables or turns on the proximity sensors 12 based on the motion state determined in block 32. For example, in one embodiment, the sensor controller 15 instructs the proximity sensors 12 to begin measuring distances in response to determining that the device 10 is in motion (i.e., the motion state indicates the device 10 is being moved by a user) in block 32. In one embodiment, the sensor controller 15 enables the proximity sensors 12 by transmitting an enable signal to the proximity sensors 12. In one embodiment, the proximity sensors 12 are returned to the off state upon determining the covered state in block 24 or after a timeout value.

In block 34, the sensor controller 15 determines an in-bag state of the device 10. The in-bag state of the device 10 indicates whether or not the device 10 is in a bag (e.g., a briefcase, backpack, sleeve, or any other type of container used to hold the device). The sensor controller 15 determines the in-bag state based on the covered state determined in block 24 and the motion state determined in block 32. The in-bag state may also be an in-transit state, indicative of a user's movement of the electronic device to a different location or otherwise not in active use and not resting on a fixed surface.

In one embodiment, the sensor controller 15 determines that the device 10 is in the in-bag state in a case where the device 10 is in the covered state (i.e., the device 10 is currently covered by an object) and is in the motion state (i.e., the device 10 is being moved by a user). Conversely, in one embodiment, the sensor controller 15 determines that the device 10 is not in the in-bag state (i.e., the device 10 is outside of the bag and in an out-of-bag state) in a case where the device 10 is not in the covered state (i.e., the device 10 is currently uncovered) regardless of whether the device 10 is in the motion state.

In one embodiment, the sensor controller 15 determines that the device 10 is in the in-bag state in a case where the device 10 is in the covered state (i.e., the device 10 is currently covered by an object) and the motion state is the device 10 is currently being placed in a bag. Conversely, in one embodiment, the sensor controller 15 determines that the device 10 is not in the in-bag state (i.e., the device 10 is outside of the bag and in an out-of-bag state) in a case where the device 10 is either not in the covered state (i.e., the device 10 is currently uncovered) or the motion state is the device 10 is not currently being placed in a bag.

In one embodiment, the sensor controller 15 determines that the device 10 is in the in-bag state in a case where the device 10 is in the covered state (i.e., the device 10 is currently covered by an object) and the motion state is the device 10 is being taken out of a bag. Conversely, in one embodiment, the sensor controller 15 determines that the device 10 is not in the in-bag state (i.e., the device 10 is outside of the bag and in an out-of-bag state) in a case where the device 10 is either not in the covered state (i.e., the device 10 is currently uncovered) or the motion state is the device is being taken out of the bag.

In one embodiment, the sensor controller 15 determines that the device 10 is in the in-bag state in a case where the device 10 is in the covered state (i.e., the device 10 is currently covered by an object) and the motion state is the device 10 is currently being placed in a bag. Conversely, in one embodiment, the sensor controller 15 determines that the device 10 is not in the in-bag state (i.e., the device 10 is outside of the bag and in an out-of-bag state) in a case where the device 10 is either not in the covered state (i.e., the device 10 is currently uncovered) or the motion state is the device 10 is being taken out of the bag.

According to one embodiment, the covered state is a probability value of the device 10 being covered, and the motion state is a probability value of the device 10 being in motion.

In one embodiment, the sensor controller 15 determines that the device 10 is in the in-bag state (i.e., the device 10 is in a bag) in a case where the probability value of the device 10 being covered is greater than a first threshold value and the probability value of the device being in motion is greater than a second threshold value. Conversely, the sensor controller 15 determines that the device 10 is not in the in-bag state (i.e., the device 10 is outside of a bag and in an out-of-bag state) in a case where the probability value of the device 10 being covered is less than the first threshold value regardless of whether the probability value of the device being in motion is less than or greater than the second threshold value.

In one embodiment, the sensor controller 15 determines that the device 10 is in the in-bag state (i.e., the device 10 is in a bag) in a case where the multiplication of the probability value of the device 10 being covered and the probability value of the device being in motion is greater than a threshold value. Conversely, the sensor controller 15 determines that the device 10 is not in the in-bag state (i.e., the device 10 is outside of a bag and in an out-of-bag state) in a case where the multiplication of the probability value of the device 10 being covered and the probability value of the device being in motion is less than the threshold value.

According to one embodiment, the covered state is a probability value of the device 10 being covered, and the motion state is a probability value of the device 10 being placed in a bag.

In one embodiment, the sensor controller 15 determines that the device 10 is in the in-bag state (i.e., the device 10 is in a bag) in a case where the probability value of the device 10 being covered is greater than a first threshold value and the probability value of the device being placed in a bag is greater than a second threshold value. Conversely, the sensor controller 15 determines that the device 10 is not in the in-bag state (i.e., the device 10 is outside of a bag and in an out-of-bag state) in a case where either the probability value of the device 10 being covered is less than the first threshold value or the probability value of the device being placed in a bag is less than the second threshold value.

In one embodiment, the sensor controller 15 determines that the device 10 is in the in-bag state (i.e., the device 10 is in a bag) in a case where the multiplication of the probability value of the device 10 being covered and the probability value of the device being placed in a bag is greater than a threshold value. Conversely, the sensor controller 15 determines that the device 10 is not in the in-bag state (i.e., the device 10 is outside of a bag and in an out-of-bag state) in a case where the multiplication of the probability value of the device 10 being covered and the probability value of the device being placed in a bag is less than the threshold value.

According to one embodiment, the covered state is a probability value of the device 10 being covered, and the motion state is a probability value of the device 10 being taken out of a bag.

In one embodiment, the sensor controller 15 determines that the device 10 is in the in-bag state (i.e., the device 10 is in a bag) in a case where the probability value of the device 10 being covered is greater than a first threshold value and the probability value of the device being taken out of a bag is less than a second threshold value. Conversely, in one embodiment, the sensor controller 15 determines that the device 10 is not in the in-bag state (i.e., the device 10 is outside of a bag and in an out-of-bag state) in a case where either the probability value of the device 10 being covered is less than the first threshold value or the probability value of the device being taken out of a bag is greater than the second threshold value.

In one embodiment, the sensor controller 15 determines that the device 10 is in the in-bag state (i.e., the device 10 is in a bag) in a case where the multiplication of the probability value of the device 10 being covered and the probability value of the device being taken out of a bag is greater than a threshold value. Conversely, in one embodiment, the sensor controller 15 determines that the device 10 is not in the in-bag state (i.e., the device 10 is outside of a bag and in an out-of-bag state) in a case where the multiplication of the probability value of the device 10 being covered and the probability value of the device being taken out of a bag is less than the threshold value.

In block 36, the sensor controller 15 adjusts a power state of the device 10 based on the in-bag state determined in block 34. In one embodiment, the sensor controller 15 adjusts a power state of the device 10 by transmitting an instruction signal to an operating system of the device 10. The relationship between the sensor controller 15 and the operating system will be discussed in further detail below.

The power state of the device 10 may include any type of low, normal, or high power state now known or later developed. In one embodiment, the device 10 includes one or more of the following power states: a working state, a low power/standby state, a sleep state, a hibernate state, a soft off state, and a mechanical off state. In the working state, the device 10 is fully powered and ready to be used by a user. In the low power/standby state, the device 10 consumes less power than the working power state and is able to quickly switch to the working state. In the sleep state, the device 10 appears to be in an off state and consumes less power than the low power/standby state. In the hibernate state, the device 10 appears to be in an off state and consumes less power than the sleep state. In the soft off state, the device 10 appears to be in an off state and includes a full shutdown and reboot cycle. In the mechanical off state, the device 10 is in an off state and consumes no power.

In one embodiment, in a case where the device 10 is in the in-bag state (i.e., the device 10 is in a bag), the sensor controller 15 sets the device 10 to the mechanical off state.

In one embodiment, in a case where the device 10 is not in the in-bag state (i.e., the device 10 is outside of a bag and in an out-of-bag state), the sensor controller 15 sets the device 10 to the working state, the low power/standby state, the sleep state, the hibernate state, or the soft off state.

Using both the covered state and the motion state discussed above, the sensor controller 15 is able to detect the in-bag state in different scenarios with high accuracy and robustness. FIGS. 4 to 13 illustrate different exemplary scenarios in which the sensor controller 15 is able to detect the in-bag state.

FIGS. 4, 6, 8, 10, and 12 show motion measurements by a motion sensor 14 in the different scenarios. In FIGS. 4, 6, 8, 10, and 12, the motion sensor 14 is a 3-axis accelerometer; and signals 38, 40, and 42 are the acceleration of the device 10 along the x, y, and z axis, respectively (referring to FIGS. 1A and 1B). However, as discussed above, the motion sensor 14 may be another type of motion sensor, such as a single axis accelerometer and a gyroscope. The horizontal axis represents time, and the vertical axis represents acceleration (meters/second).

FIGS. 5, 7, 9, 11, and 13 show distance measurements by a proximity sensor 12 in the different scenarios. The horizontal axis represents time, and the vertical axis represents distance (centimeters).

Figure 4:
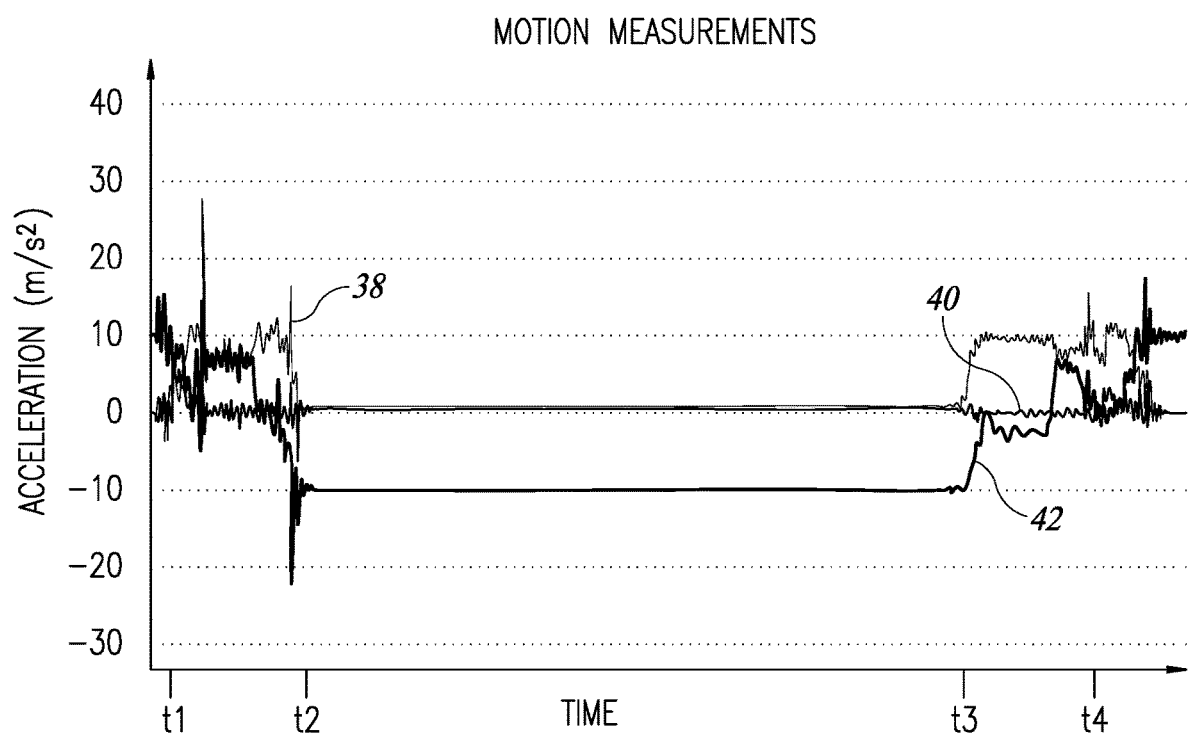
FIG. 4 is motion measurements by a motion sensor in a first scenario according to an embodiment disclosed herein.
Figure 5:
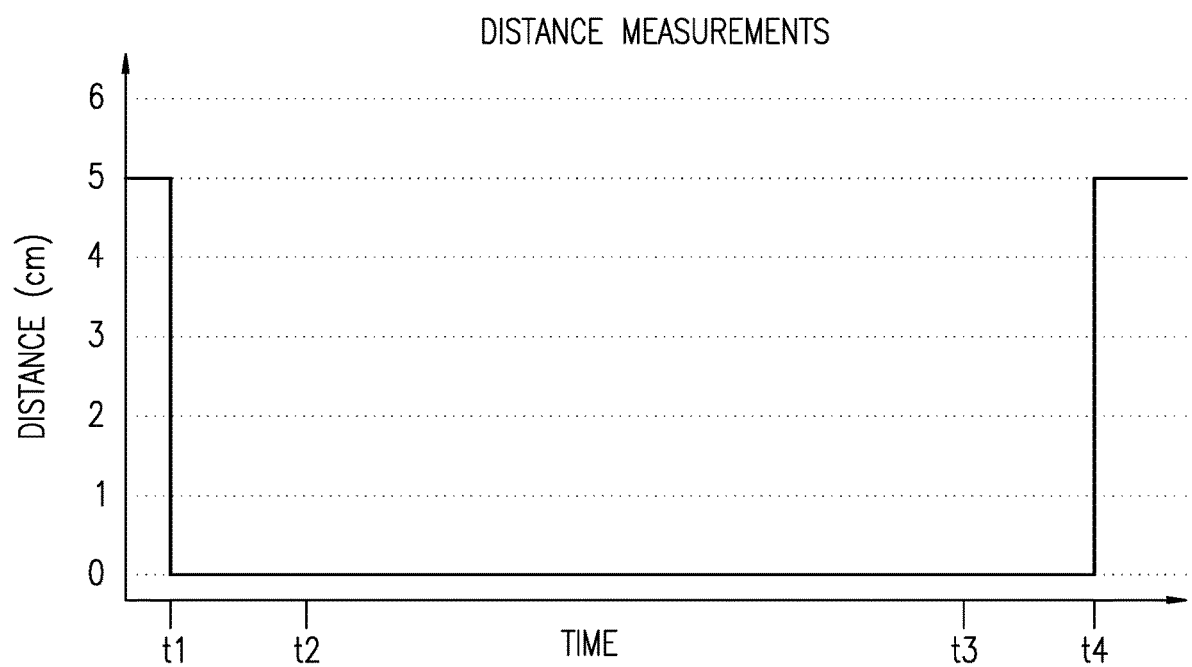
FIG. 5 is distance measurements by a distance sensor in the first scenario according to an embodiment disclosed herein.

In a first scenario, the device 10 is inserted into a bag at time t1; positioned on, for example, a table while in the bag between times t2 and t3; and taken out of the bag at time t4. FIG. 4 is motion measurements by the motion sensor 14 in the first scenario according to an embodiment disclosed herein. FIG. 5 is distance measurements by the proximity sensors 12 in the first scenario according to an embodiment disclosed herein. It is beneficial to review FIGS. 4 and 5 together.

At time t1, referring to FIG. 4, the acceleration of the device 10 along the x, y, and z axes begin to fluctuate because the device 10 is being moved. Further, referring to FIG. 5, the distance between the device 10 and a target object decreases to zero because the device 10 is inserted in and covered by the bag. Thus, at time t1, the sensor controller 15 determines that the device 10 is in the motion state and the covered state, and, as a result, that the device 10 is in the in-bag state.

Between times t2 and t3, referring to FIG. 4, the acceleration of the device 10 along the x and y axes decreases to zero, and the acceleration of the device 10 along the z axis decreases to below zero because the device 10 is positioned on the table and left stationary. Further, referring to FIG. 5, the distance between the device 10 and a target object remains at zero because the device 10 is still in the bag. Thus, between times t2 and t3, the sensor controller 15 determines that the device 10 is not in the motion state but still in the covered state. In this case, in one embodiment, the sensor controller 15 determines that the device 10 is still in the in-bag state because the sensor controller 15 does not detect an out-of-bag state subsequent to detecting the in-bag state at time t1.

At time t4, referring to FIG. 4, the acceleration of the device 10 along the x, y, and z axes begin to fluctuate because the device 10 is moved again. Further, referring to FIG. 5, the distance between the device 10 and the target object increases because the device 10 is taken out of the bag and no longer covered by the bag. Thus, at time t4, the sensor controller 15 determines that the device 10 is in the motion state and not in the covered state, and, as a result, that the device 10 is not in the in-bag state (i.e., the device 10 is outside of the bag and in an out-of-bag state).

In the first scenario, in one embodiment, the sensor controller 15 sets the device 10 to the mechanical off state between times t1 and t4. In one embodiment, the sensor controller 15 sets the device 10 to the working state, the low power/standby state, the sleep state, the hibernate state, or the soft off state at time t4.

Figure 6:
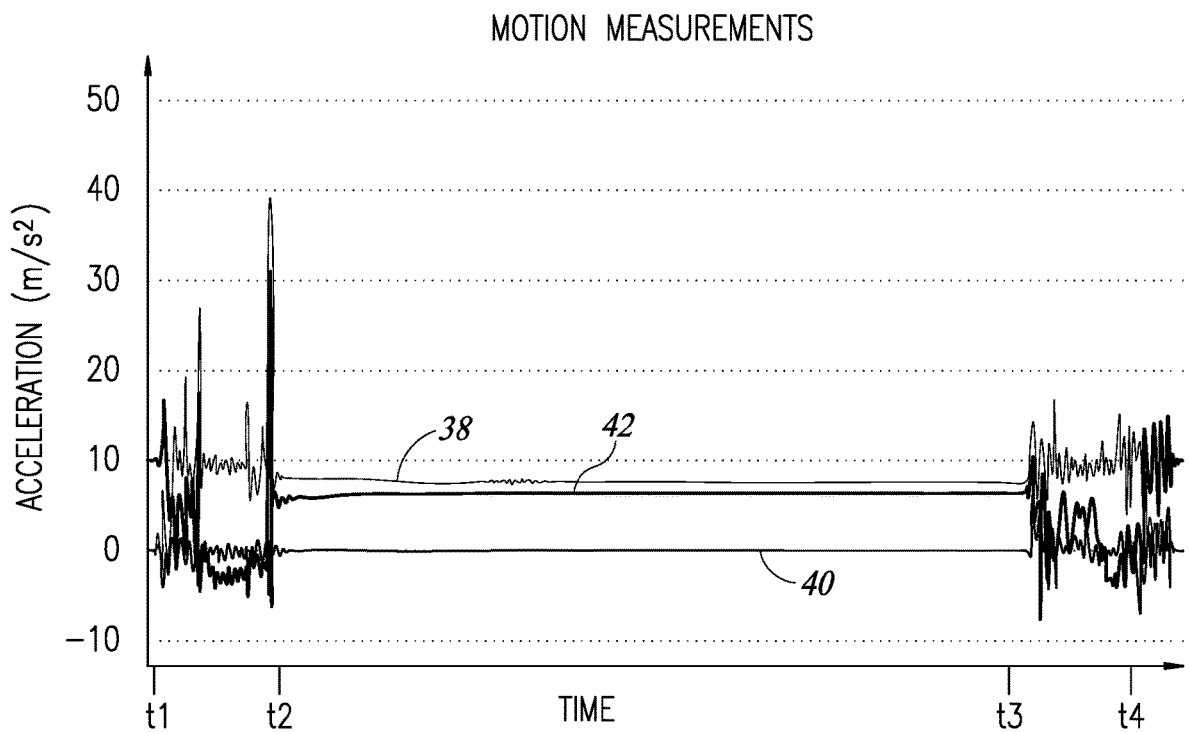
FIG. 6 is motion measurements by a motion sensor in a second scenario according to an embodiment disclosed herein.
Figure 7:
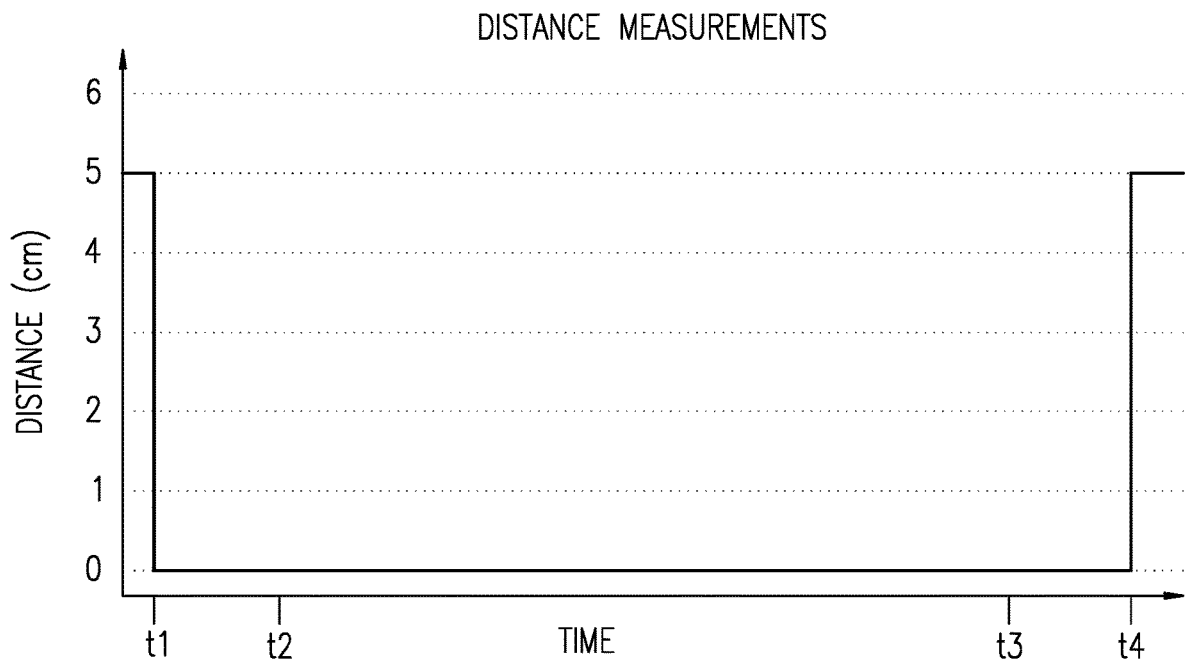
FIG. 7 is distance measurements by a distance sensor in the second scenario according to an embodiment disclosed herein.

The second scenario is similar to the first scenario except that the device 10 is positioned on the floor instead of a table. In the second scenario, the device 10 is inserted into a bag at time t1; positioned on the floor while in the bag between times t2 and t3; and taken out of the bag at time t4. FIG. 6 is motion measurements by the motion sensor 14 in the second scenario according to an embodiment disclosed herein. FIG. 7 is distance measurements by the proximity sensors 12 in the second scenario according to an embodiment disclosed herein. It is beneficial to review FIGS. 6 and 7 together.

In the second scenario, the sensor controller 15 determines that the device 10 is in the in-bag state and sets the power states of the device 10, as discussed above with respect to FIGS. 4 and 5. However, referring to FIG. 6, it is noted that signal 40, which is acceleration along the z axis, is greater than zero because the device 10 is positioned on the floor instead of the table.

Figure 8:
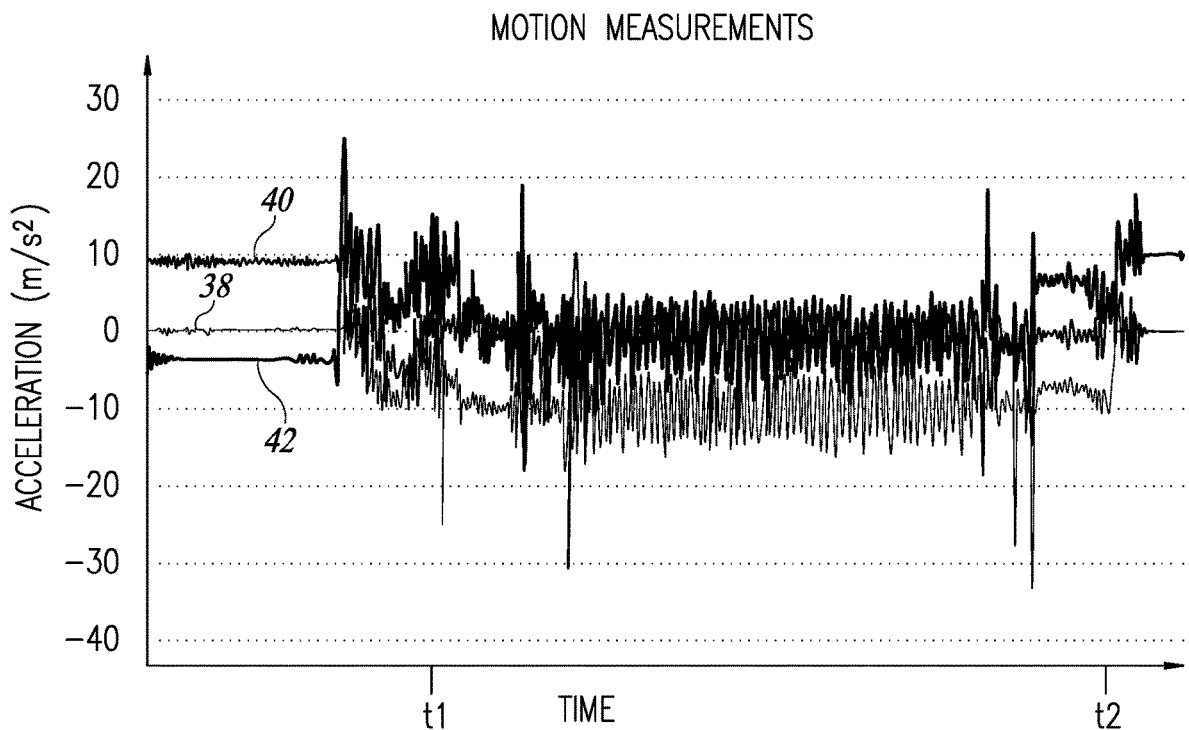
FIG. 8 is motion measurements by a motion sensor in a third scenario according to an embodiment disclosed herein.
Figure 9:
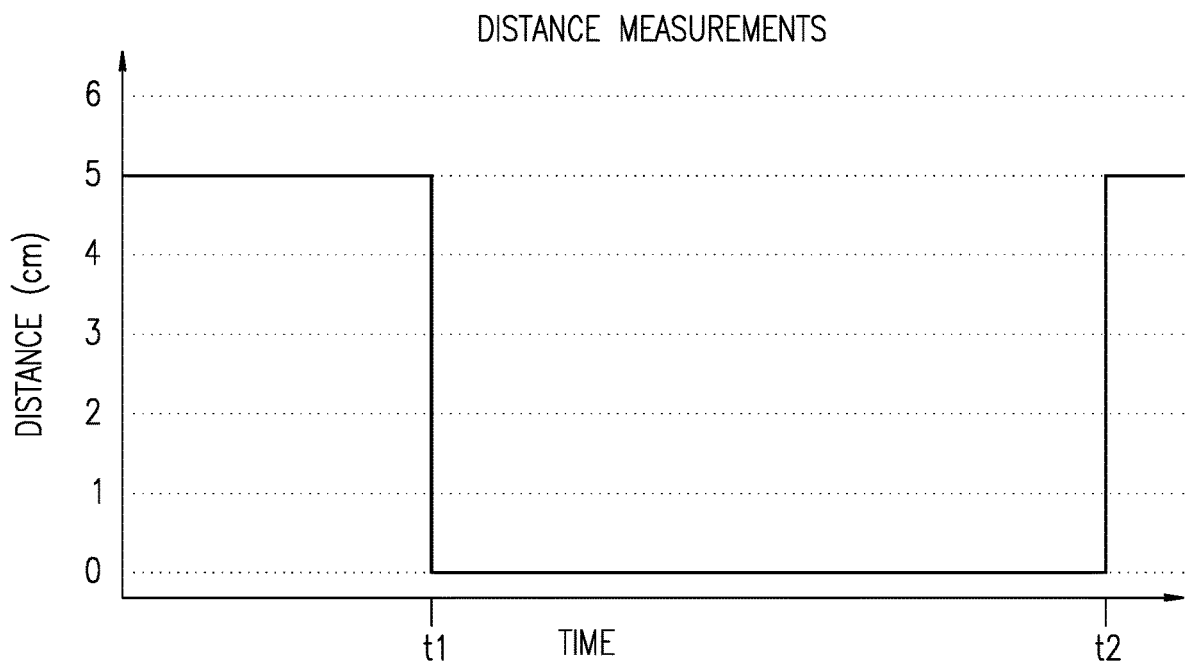
FIG. 9 is distance measurements by a distance sensor in the third scenario according to an embodiment disclosed herein.

In a third scenario, the device 10 is inserted into a backpack at time t1; carried in the backpack while walking between times t1 and t2; and taken out of the backpack at time t2. FIG. 8 is motion measurements by the motion sensor 14 in the third scenario according to an embodiment disclosed herein. FIG. 9 is distance measurements by the proximity sensors 12 in the third scenario according to an embodiment disclosed herein. It is beneficial to review FIGS. 8 and 9 together.

At time t1, referring to FIG. 8, the acceleration of the device 10 along the x, y, and z axes begins to fluctuate because the device 10 is being moved. Further, referring to FIG. 9, the distance between the device 10 and a target object decreases to zero because the device 10 is inserted in and covered by the backpack. Thus, at time t1, the sensor controller 15 determines that the device 10 is in the motion state and the covered state, and, as a result, that the device 10 is in the in-bag state.

Between times t1 and t2, referring to FIG. 8, the acceleration of the device 10 along the x, y, and z axes continues to fluctuate because the device 10 is being carried and walked with. Further, referring to FIG. 9, the distance between the device 10 and a target object remains at zero because the device 10 is still in the backpack. Thus, between times t1 and t2, the sensor controller 15 determines that the device 10 is not in the motion state but still in the covered state. Thus, between times t1 and t2, the sensor controller 15 determines that the device 10 is in the motion state and the covered state, and, as a result, that the device 10 is still in the in-bag state.

At time t2, referring to FIG. 8, the acceleration of the device 10 along the x, y, and z axes continues to fluctuate because the device 10 is still being moved while taken out of the backpack. Further, referring to FIG. 9, the distance between the device 10 and the target object increases because the device 10 is taken out of the backpack and no longer covered by the backpack. Thus, at time t2, the sensor controller 15 determines that the device 10 is in the motion state and not in the covered state, and, as a result, that the device 10 is not in the in-bag state (i.e., the device 10 is outside of the backpack and in an out-of-bag state).

In the third scenario, in one embodiment, the sensor controller 15 sets the device 10 to the mechanical off state between times t1 and t2. In one embodiment, the sensor controller 15 sets the device 10 to the working state, the low power/standby state, the sleep state, the hibernate state, or the soft off state at time t2.

Figure 10:
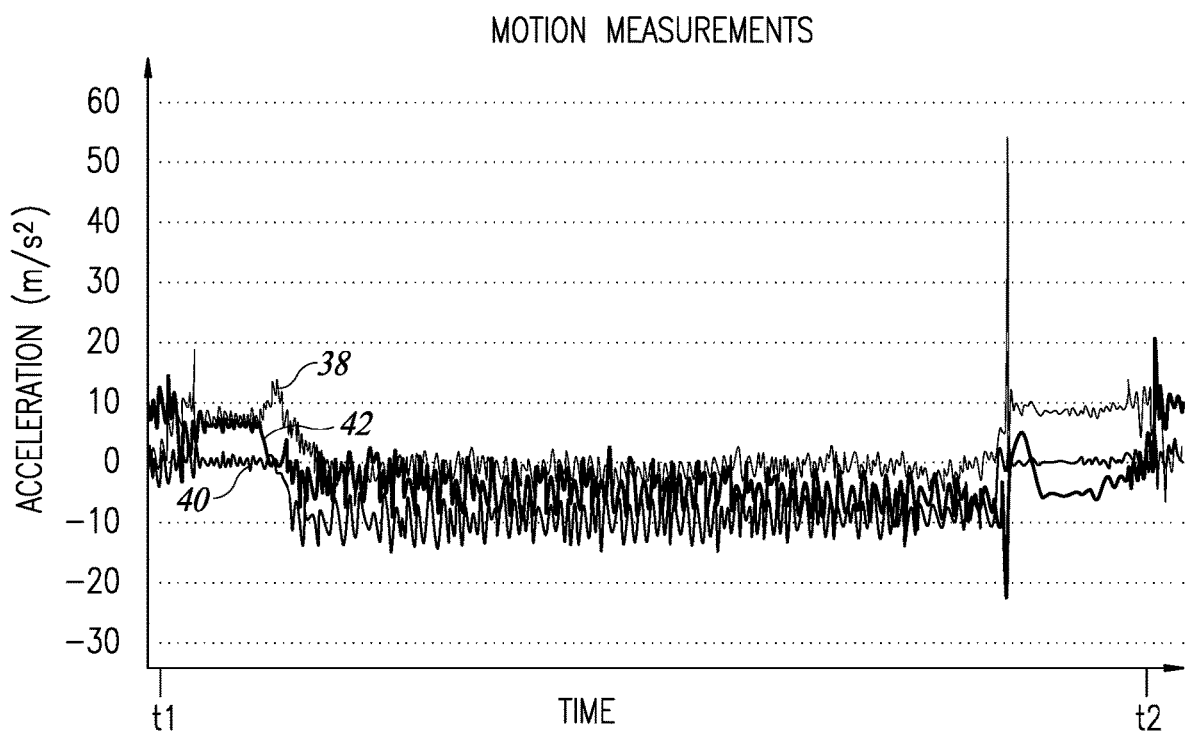
FIG. 10 is motion measurements by a motion sensor in a fourth scenario according to an embodiment disclosed herein.

The fourth scenario is similar to the third scenario except that the device 10 is placed in a briefcase instead of the backpack. In the fourth scenario, the device 10 is inserted into the briefcase at time t1; carried in the briefcase while walking between times t1 and t2; and taken out of the briefcase at time t2. FIG. 10 is motion measurements by the motion sensor 14 in the fourth scenario according to an embodiment disclosed herein.

Figure 11:
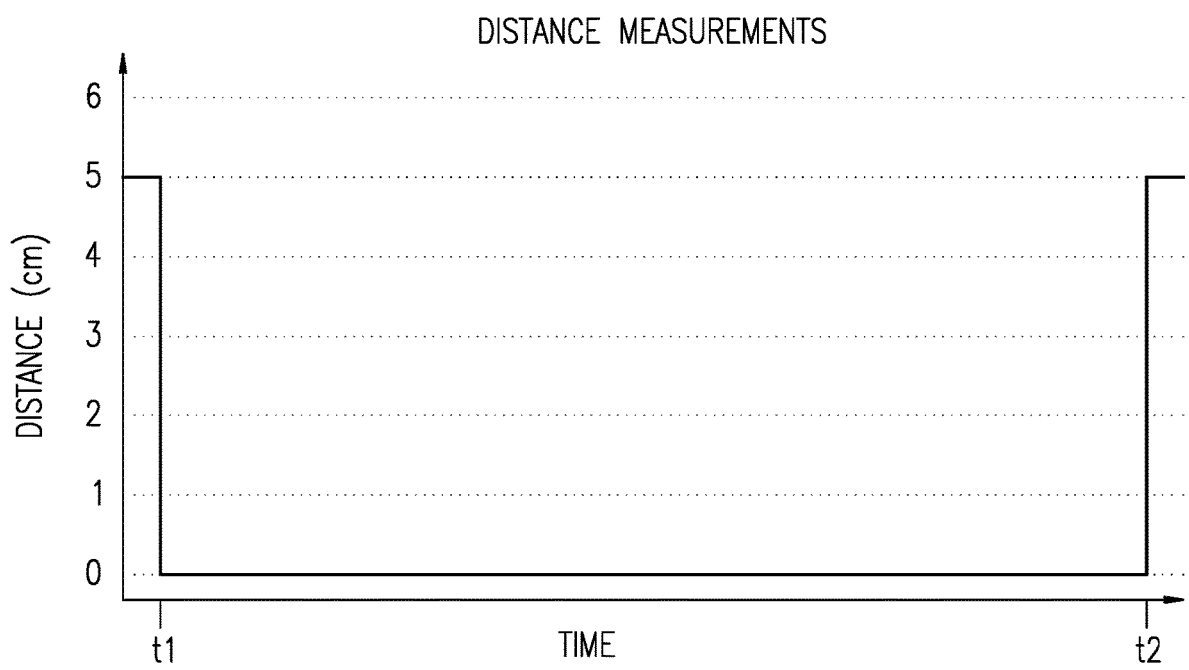
FIG. 11 is distance measurements by a distance sensor in the fourth scenario according to an embodiment disclosed herein.

FIG. 11 is distance measurements by the proximity sensors 12 in the fourth scenario according to an embodiment disclosed herein. It is beneficial to review FIGS. 10 and 11 together.

In the fourth scenario, the sensor controller 15 determines that the device 10 is in the in-bag state and sets the power states of the device 10, as discussed above with respect to FIGS. 8 and 9.

Figure 12:
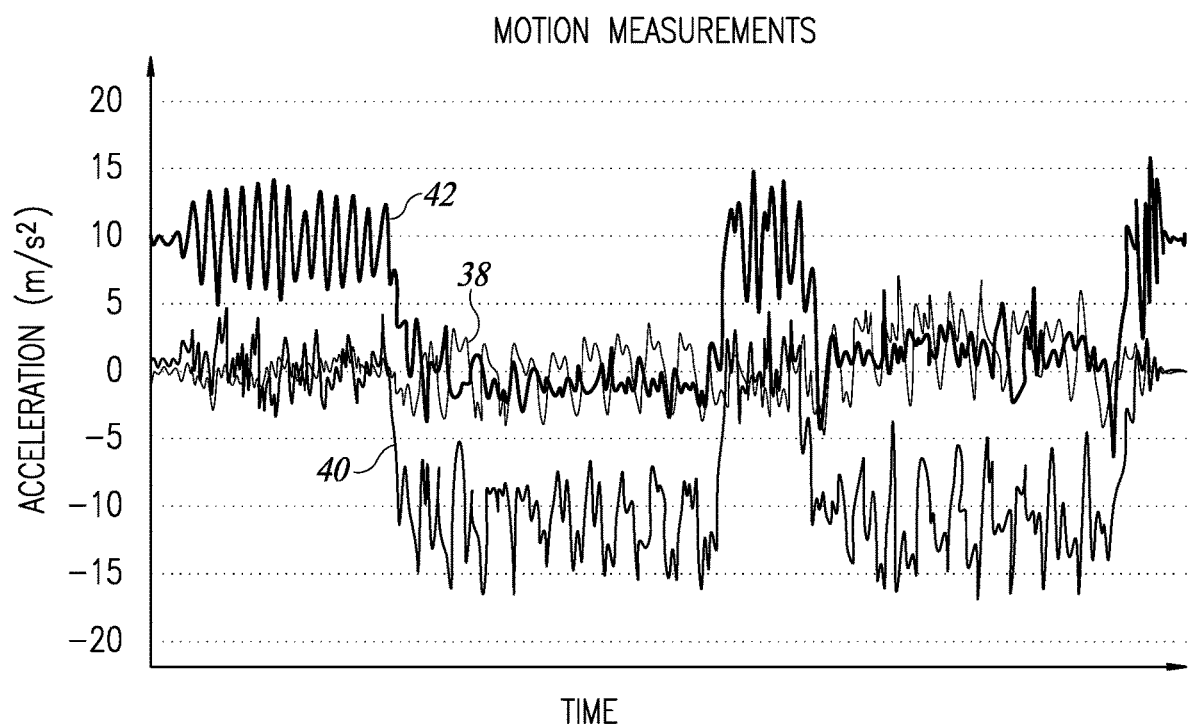
FIG. 12 is motion measurements by a motion sensor in a fifth scenario according to an embodiment disclosed herein.
Figure 13:
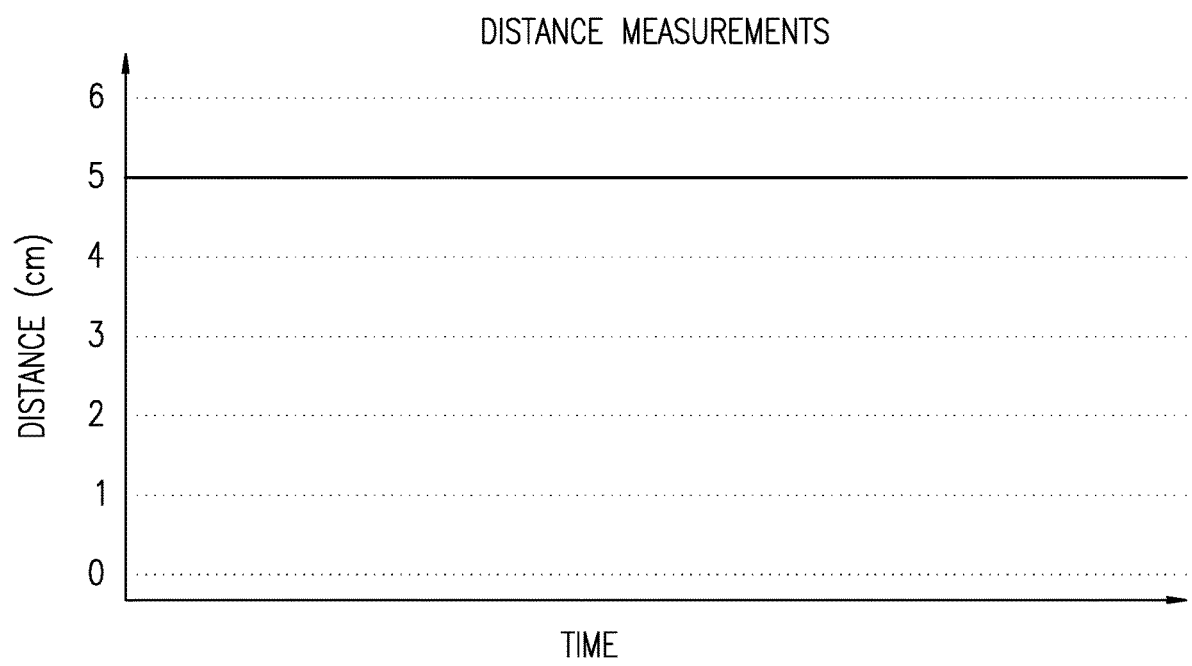
FIG. 13 is distance measurements by a distance sensor in the fifth scenario according to an embodiment disclosed herein.

In a fifth scenario, the device 10 is carried outside of a bag (e.g., the device 10, itself, is carried by hand without a bag) while walking. FIG. 12 is motion measurements by the motion sensor 14 in the fifth scenario according to an embodiment disclosed herein. FIG. 13 is distance measurements by the proximity sensors 12 in the fifth scenario according to an embodiment disclosed herein. It is beneficial to review FIGS. 12 and 13 together.

Referring to FIG. 12, the acceleration of the device 10 along the x, y, and z axes fluctuates because the device 10 is being carried and walked with. Further, referring to FIG. 3, the distance between the device 10 and a target object is high (e.g., 5 cm) because the device 10 is not in a bag. Thus, the sensor controller 15 determines that the device 10 is in the motion state and not in the covered state, and, as a result, that the device 10 is not in the in-bag state (i.e., the device 10 is outside of a bag and in an out-of-bag state). In the fifth scenario, in one embodiment, the sensor controller 15 sets the device 10 to the working state, the low power/standby state, the sleep state, the hibernate state, or the soft off state because the user is likely temporarily transporting the device 10 and intends to use the device 10 shortly.

Regarding the fifth scenario, in a case where the in-bag state is determined based on motion measurements but not on distance measurements, a sensor controller may incorrectly determine that the device 10 is in the in-bag state. For example, the sensor controller may incorrectly assume that the device 10 is in the in-bag state because the motion measurements indicate the device 10 is in transport, and set the device 10 to the mechanical off state. In contrast, the sensor controller 15 disclosed herein is able to correctly determine the in-bag state in the fifth scenario because the sensor controller 15 utilizes distance measurements in addition to motion measurements. Namely, the sensor controller 15 is able to determine that the user is likely temporarily transporting the device 10 and intends to use the device 10 shortly because the device 10 is not in the covered state. Accordingly, the sensor controller 15 may set the device 10 to a low/intermediate power state instead of a mechanical off state, and, thus, improve the user's experience.

Figure 14:
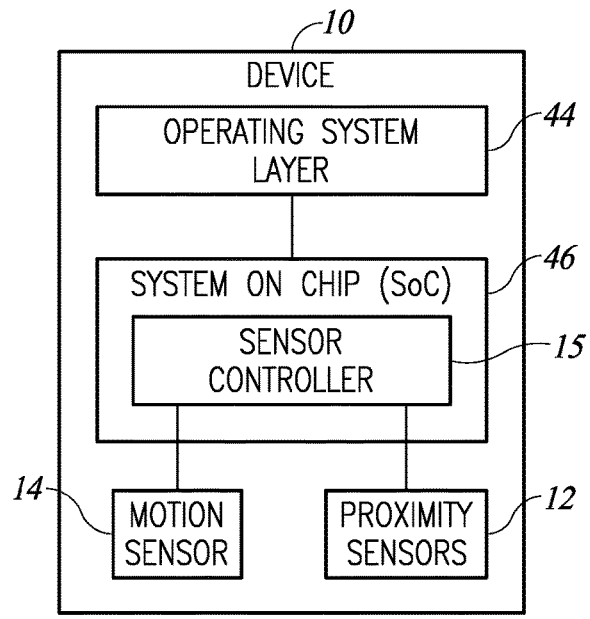
FIG. 14 is a block diagram of a device according to an embodiment disclosed herein.
Figure 15:
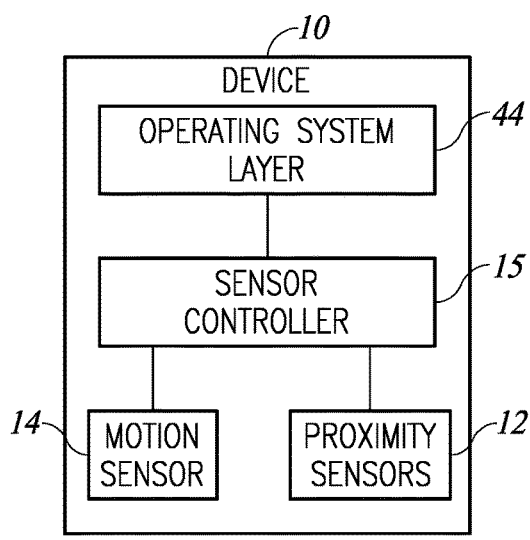
FIG. 15 is a block diagram of a device according to an embodiment disclosed herein.
Figure 16:
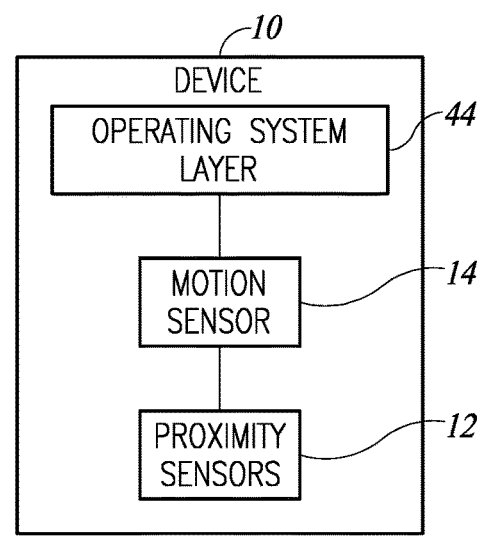
FIG. 16 is a block diagram of a device according to an embodiment disclosed herein.

The program or algorithm to perform the in-bag state detection discussed above may be implemented in several different locations within the device 10. FIGS. 14 to 16 illustrate different implementations of the device 10.

FIG. 14 is a block diagram of the device 10 according to an embodiment disclosed herein. The device 10 includes an operating system layer 44, a system on chip (SOC) 46, the proximity sensors 12, the motion sensor 14, and the sensor controller 15.

The operating system layer 44 includes an operating system of the device 10 that, for example, controls and coordinates the hardware components of the device 10 and any peripheral devices communicatively coupled to the device 10. The SOC 46 is communicatively coupled to the operating system layer 44. The SOC 46 is, for example, an integrated circuit that includes the hardware components of the device 10, such as a processing unit, memory, input/output ports, etc. The motion sensor 14 and the proximity sensors 12 are communicatively coupled to the sensor controller 15. As discussed above, the motion sensor 14 and the proximity sensors 12 transmit motion measurements and distance measurements, respectively, to the sensor controller 15. The sensor controller 15 is included in the SOC 46. As discussed above, the sensor controller 15 receives distance measurements from the proximity sensors 12 and motion measurements from the motion sensor 14, and determines whether the device 10 is in the in-bag state based on the distance measurements and motion measurements.

FIG. 15 is a block diagram of the device 10 according to an embodiment disclosed herein. Similar to the embodiment shown in FIG. 14, the device 10 includes the operating system layer 44, the proximity sensors 12, the motion sensor 14, and the sensor controller 15. However, in contrast to the embodiment shown in FIG. 14, the device 10 does not include the SOC 46. Rather, the sensor controller 15 is communicatively coupled directly with the operating system layer 44, without the SOC 46 being an intervening connection.

FIG. 16 is a block diagram of the device 10 according to an embodiment disclosed herein. Similar to the embodiment shown in FIG. 15, the device 10 includes the operating system layer 44, the proximity sensors 12, and the motion sensor 14. However, in contrast to the embodiment shown in FIG. 15, the device 10 does not include the SOC 46 and the sensor controller 15. Instead, the motion sensor 14 is communicatively coupled to the operating system layer 44, and the proximity sensors 12 are communicatively coupled to the motion sensor 14. In this embodiment, the motion sensor 14 is capable of performing processing operations, and the operations of the sensor controller 15 are implemented directly in hardware of the motion sensor 14. For example, the motion sensor 14 receives distance measurements from the proximity sensors 12, determines the covered state, determines the motion state, determines the in-bag state, and adjusts the power state of the device, as discussed above. The motion sensor 14 may adjust the power state of the device by passing information or instructions to the system (e.g. the operating system layer 44 or a dedicated microcontroller unit that handles changing of the power state of the device) to perform the actual adjustment of the power state of the device. The various embodiments shown in FIGS. 14 to 16 have different current consumptions. The current consumption of the embodiment shown in FIG. 14 is greater than the current consumption of the embodiment shown in FIG. 15, and the current consumption of the embodiment shown in FIG. 15 is greater than the current consumption of the embodiment shown in FIG. 16. A manufacturer may adjust the implementation of the in-bag detection disclosed herein to meet various power requirements of the device 10.

The various embodiment disclosed herein provide a device that detects whether the device is in a bag or outside of the bag. The device determines whether the device is in or outside of the bag based on distance measurements generated by at least one proximity sensor and motion measurements generated by at least one motion sensor. By using both distance measurements and motion measurements, the device is able to detect whether the device is in the bag or outside of the bag with high accuracy and robustness. The device subsequently adjusts a power state of the device based on whether the device is in the bag or outside of the bag.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
    a motion sensor configured to measure a motion, and generate a motion measurement based on the measured motion;
    a proximity sensor configured to measure a distance, and generate a distance measurement based on the distance; and
    a controller configured to:
        receive the motion measurement and the distance measurement;
        determine a motion state of the device based on the motion measurement, the motion state being a first probability value, the first probability value indicating a likelihood that the device is being inserted into a bag in a case where the motion measurement indicates the measured motion is in a first direction, the first probability value indicating a likelihood that the device is being taken out of the bag in a case where the motion measurement indicates the measured motion is in a second direction opposite to the first direction;
        determine a covered state of the device based on the distance measurement, the covered state being a second probability value indicating a likelihood that the device is covered by an object;
        determine the device is in a state selected from an in-bag state and an out-of-bag state based on a multiplication of the first probability value and the second probability value, the in-bag state indicating the device is in the bag, the out-of-bag, state indicating the device is outside of the bag; and adjust a power state of the device based on the determined state of the device.

2. The device of claim 1 wherein the controller adjusts the power state of the device by instructing an operating system of the device to change the power state of the device.

3. The device of claim 1 wherein the power state includes at least one of a working state, a low power state, a sleep state, a hibernate state, a soft off state, or a mechanical off state.

4. The device of claim 1 wherein the motion sensor is an accelerometer, and the motion measurement is an acceleration measurement.

5. The device of claim 1 wherein the motion sensor includes an accelerometer and a gyroscope, and the motion measurement includes an acceleration measurement and an angular velocity measurement.

6. The device of claim 1 wherein the proximity sensor is enabled to start the measurement of the distance based on the motion measurement.

7. The device of claim 1, further comprising:
a system on chip (SoC), the controller being included in the SoC.

8. The device of claim 1 wherein the second probability value is determined with a probability curve that is linear or curved.

9. A device, comprising:
a motion sensor configured to generate a motion measurement;
a plurality of proximity sensors configured to generate a plurality of distance measurements, respectively, the device including a plurality of surfaces facing different directions, each of the plurality of proximity sensors positioned at a respective surface of the plurality of surfaces; and
a controller configured to:
determine a motion state of the device based on the motion measurement, the motion state being a first probability value, the first probability value indicating a likelihood that the device is being inserted into a bag in a case where the motion measurement indicates a motion in a first direction, the first probability value indicating a likelihood that the device is being taken out of the bag in a case where the motion measurement indicates a motion in a second direction opposite to the first direction;
determine a covered state of the device based on the plurality of distance measurements, the covered state being a second probability value indicating a likelihood that the device is covered by an object;
determine the device is in a state selected from an in-bag state and an out-of-bag state based on a multiplication of the first probability value and the second probability value, the in-bag state indicating the device is in the bag, the out-of-bag state indicating the device is outside of the bag; and
adjust a power state of the device based on the ha-determined state of the device.

10. The device of claim 9 wherein the second probability value is determined with a probability curve that is linear or curved.

11. A system, comprising:
an electronic device;
a proximity sensor coupled to the electronic device and configured to generate a distance measurement; and
a motion sensor coupled to the electronic device and configured to:
generate a motion measurement;
determine a motion state based on the motion measurement, the motion state being a first probability value, the first probability value indicating a likelihood that the electronic device is being inserted into a bag in a case where the motion measurement indicates a motion in a first direction, the first probability value indicating a likelihood that the electronic device is being taken out of the bag in a case where the motion measurement indicates a motion in a second direction opposite to the first direction;
determine a covered state based on the distance measurement, the covered state being a second probability value indicating a likelihood that the electronic device is covered by an object;
determine the electronic device is in a state selected from an in-bare state and an out-of-bag state based on a multiplication of the first probability value and the second probability value, the in-bag state indicating the electronic device is in the bag, the out-of-bag state indicating the electronic device is outside of the bag; and
adjust a power state of the electronic device based on the determined state of the electronic device.

12. The system of claim 11 wherein the second probability value is determined with a probability curve that is linear or curved.

* * * * *

UNITED STATES PATENT AND TRADEMARK OFFICE
CERTIFICATE OF CORRECTION

PATENT NO. : 11,821,732 B2
APPLICATION NO. : 17/144016
DATED : November 21, 2023
INVENTOR(S) : Stefano Paolo Rivolta et al.

Page 1 of 1

It is certified that error appears in the above-identified patent and that said Letters Patent is hereby corrected as shown below:

In the Claims

Column 18, Claim 9, Lines 11-12:
"based on the ha-determined state" should read: --based on the determined state--.

Column 18, Claim 11, Line 37:
"an in-bare state" should read: --an in-bag state--.

Signed and Sealed this
Second Day of January, 2024

Katherine Kelly Vidal
*Director of the United States Patent and Trademark Office*